(12) United States Patent
Kawamura et al.

(10) Patent No.: US 8,751,727 B2
(45) Date of Patent: Jun. 10, 2014

(54) STORAGE APPARATUS AND STORAGE SYSTEM

(75) Inventors: Keita Kawamura, Kanagawa (JP); Shingo Aso, Tokyo (JP)

(73) Assignee: Sony Corporation, Tokyo (JP)

( * ) Notice: Subject to any disclaimer, the term of this patent is extended or adjusted under 35 U.S.C. 154(b) by 191 days.

(21) Appl. No.: 13/036,099

(22) Filed: Feb. 28, 2011

(65) Prior Publication Data

US 2011/0231622 A1    Sep. 22, 2011

(30) Foreign Application Priority Data

Mar. 17, 2010   (JP) ................. 2010-060207

(51) Int. Cl.
*G11C 16/10* (2006.01)
*G06F 12/02* (2006.01)

(52) U.S. Cl.
USPC .............. 711/103; 711/165; 711/E12.008; 711/E12.009; 707/813

(58) Field of Classification Search
None
See application file for complete search history.

(56) References Cited

U.S. PATENT DOCUMENTS

| | | | | |
|---|---|---|---|---|
| 5,481,670 A | * | 1/1996 | Hatashita et al. | 714/6.32 |
| 5,590,332 A | * | 12/1996 | Baker | 717/151 |
| 5,842,016 A | * | 11/1998 | Toutonghi et al. | 711/165 |
| 5,970,249 A | * | 10/1999 | Holzle et al. | 717/153 |
| 5,999,354 A | * | 12/1999 | Shitara | 360/53 |
| 8,046,551 B1 | * | 10/2011 | Sahin | 711/162 |
| 2008/0189485 A1 | * | 8/2008 | Jung et al. | 711/115 |
| 2008/0195833 A1 | * | 8/2008 | Park | 711/171 |
| 2009/0089482 A1 | * | 4/2009 | Traister | 711/103 |
| 2010/0037010 A1 | * | 2/2010 | Yano et al. | 711/103 |
| 2010/0082878 A1 | | 4/2010 | Inoue et al. | |
| 2010/0122016 A1 | * | 5/2010 | Marotta et al. | 711/103 |
| 2010/0235715 A1 | * | 9/2010 | Thatcher et al. | 711/154 |
| 2010/0241790 A1 | * | 9/2010 | Whang et al. | 711/103 |
| 2011/0161562 A1 | * | 6/2011 | Chang et al. | 711/103 |

FOREIGN PATENT DOCUMENTS

| | | | | |
|---|---|---|---|---|
| JP | 2007-000862 | | 1/2007 | |
| JP | 2008-003684 | | 1/2008 | |
| JP | 2011-192240 A | * | 9/2011 | ............. G06F 12/02 |

OTHER PUBLICATIONS

Shelley Chen and Nikos Hardavellas. "Improving Performance through Object Fusion." Carnegie Mellon University, Dec. 4, 2008.*

* cited by examiner

*Primary Examiner* — Matthew Bradley
*Assistant Examiner* — Daniel Bernard
(74) *Attorney, Agent, or Firm* — Sony Corporation of America

(57) ABSTRACT

A storage apparatus includes: a memory allowing an operation to be carried out in order to additionally write new write data into a storage area already used for storing previous write data so as to store the new data in the storage area along with the previous write data; an input/output section configured to receive write data in a write access; and a control section configured to write the write data into the memory on the basis of the write access, wherein, in internal processing based on the write access, the control section carries out an additional-write operation for a storage area already used for storing the previous write data in the internal processing.

14 Claims, 10 Drawing Sheets

F I G . 5

| FIRST PAGES | SECOND PAGES | |
|---|---|---|
| A-0 | B-0 | → P(0) |
| A-1 | B-1 | → P(1) |
| A-2 | B-2 | |
| A-3 | B-3 | ⋮ |
| A-4 | B-4 | |
| A-5 | B-5 | |
| ⋮ | ⋮ | |
| A-N | B-N | → P(n) |

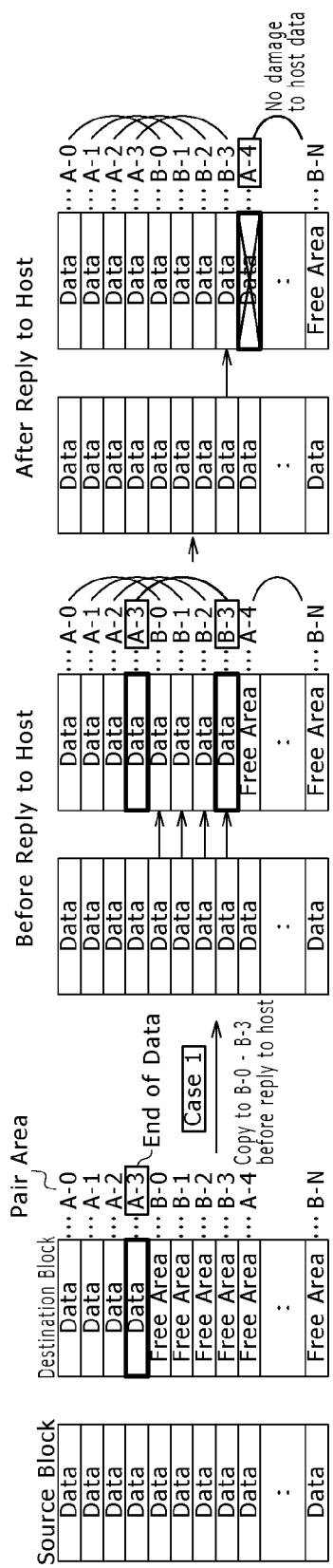

STORAGE APPARATUS AND STORAGE SYSTEM

BACKGROUND OF THE INVENTION

1. Field of the Invention

The present invention relates to a storage apparatus allowing new data to be additionally written into a storage area already used for holding previously stored write data and relates to a storage system employing the storage apparatus.

2. Description of the Related Art

A flash memory is a storage apparatus allowing data stored therein in page units.

A special flash memory allows data of a plurality of pages to be stored in a page by converting the data into multi-value data (refer to Japanese Patent Laid-open No. 2008-003684 and PCT Patent Publication No. WO2007-000862).

In the flash memory allowing data of a plurality of pages to be stored in a page by converting the data into multi-value data, for example, data of one page is written by a host apparatus by storing the data into an empty page in a first write access whereas data of the next page is additionally written by the host apparatus by storing the data into the page, in which the data of the first one page has already been stored previously, in a second write access.

SUMMARY OF THE INVENTION

In a storage apparatus such as the flash memory, however, if an operation to additionally write new data into a page in which other data has already been stored previously ends in a failure, it is quite within the bounds of possibility that the other data already stored in the page is lost from the storage apparatus.

In addition, even though the storage apparatus responds to the host apparatus to notify the host apparatus that the first operation to write data into a page of the storage apparatus has been completed but a second operation to additionally write new data into the same page ends in a failure, it is quite within the bounds of possibility that the data already stored in the page in the first operation has been lost from the storage apparatus during the second operation.

On top of that, if the host apparatus does not save the data stored in the page of the storage apparatus in the first operation, the storage apparatus is not capable of reacquiring the same data lost from the page during the second operation from the host apparatus.

Thus, it is difficult for the storage apparatus to recover the data stored in the page of the storage apparatus in the first operation but lost from the page during the second operation.

For the reason described above, the storage apparatus allowing new data to be additionally written into a storage area already used for holding data stored previously is required to be capable of preventing the data already stored previously in the storage apparatus from being lost from the storage area during the additional-write operation.

In accordance with a first embodiment of the present invention, there is provided a storage apparatus which employs:

a memory allowing an operation to be carried out in order to additionally write new data into a storage area already used for holding previously stored write data so as to store the new data in the storage area along with the previously stored write data;

an input/output section configured to receive write data in a write access; and a control section configured to write the write data in the memory on the basis of the write access.

In addition, in internal processing based on the write access, the control section carries out an additional-write operation for a storage area already used for holding previously stored write data in the internal processing.

As described above, the control section employed in the storage apparatus according to the first embodiment of the present invention stores write data into a storage area of the memory on the basis of a write access. Then, the control section carries out an additional-write operation to store new write data in the storage area already used for holding the write data stored on the basis of the write access.

Thus, in one write access, the write data written on the basis of the write access and the new write data written during the additional-write operation are stored in the storage area included in the memory.

Accordingly, in accordance with the first embodiment of the present invention, in a later write access, for a storage area already used for holding write data stored during a previous write access, an additional write operation to store new write data is not carried out.

As a result, in accordance with the first embodiment of the present invention, data of a storage area already used for holding data already written on the basis of a write access is not lost even if a write operation in a later write access ends in a failure.

In accordance with a second embodiment of the present invention, there is provided a storage system which employs a storage apparatus used for holding data written into the storage apparatus and a host apparatus for writing data into the storage apparatus. The storage apparatus employs:

a memory allowing an operation to be carried out in order to additionally write new data into a storage area already used for holding previously stored write data so as to store the new data in the storage area along with the previously stored write data;

an input/output section configured to receive write data from the host apparatus in a write access made by the host apparatus as an access to the storage apparatus; and a control section configured to write the write data in the memory on the basis of the write access made by the host apparatus as an access to the storage apparatus.

In addition, in internal processing based on the write access made by the host apparatus as an access to the storage apparatus, the control section carries out an additional-write operation for a storage area already used for holding previously stored write data received from the host apparatus in the internal processing.

In a storage apparatus provided by the present invention to serve as a storage apparatus allowing an operation to be carried out in order to additionally write new write data into a storage area already used for holding previously stored write data, the previously stored write data already held in a storage area of the storage apparatus can be prevented from being lost from the storage area due to the operation carried out to additionally store the new write data into the storage area.

BRIEF DESCRIPTION OF THE DRAWINGS

FIG. 5 is an explanatory diagram to be referred to in description of a relation between a plurality of physical pages of a physical block and storage areas of the physical block;

FIGS. 8A to 8C are a plurality of explanatory diagrams to be referred to in description of data changes obtained as a result of a garbage collection operation carried out in the period of a write access made by a host apparatus in accordance with this embodiment;

DETAILED DESCRIPTION OF THE PREFERRED EMBODIMENT

A preferred embodiment of the present invention is explained by referring to diagrams. The embodiment is described in chapters arranged in the following order.
1: Configuration of an Embodiment Implementing a Memory Card 1 and a Host Apparatus (2)
2: Structure of the Multi-Value Memory Card 1
3: Additional-Write Operation (Garbage Collection Operation) in a Write Access in this Embodiment
4: First Typical Comparison (Example of an Insufficient Additional-Write Operation in a Write Access)
5: Second Typical Comparison (Example of a Time Out of a Write-Access Successful-Completion Notice to the Host Apparatus (2))
1: Configuration of an Embodiment Implementing a Memory Card 1 and a Host Apparatus (2)

Figure 1:
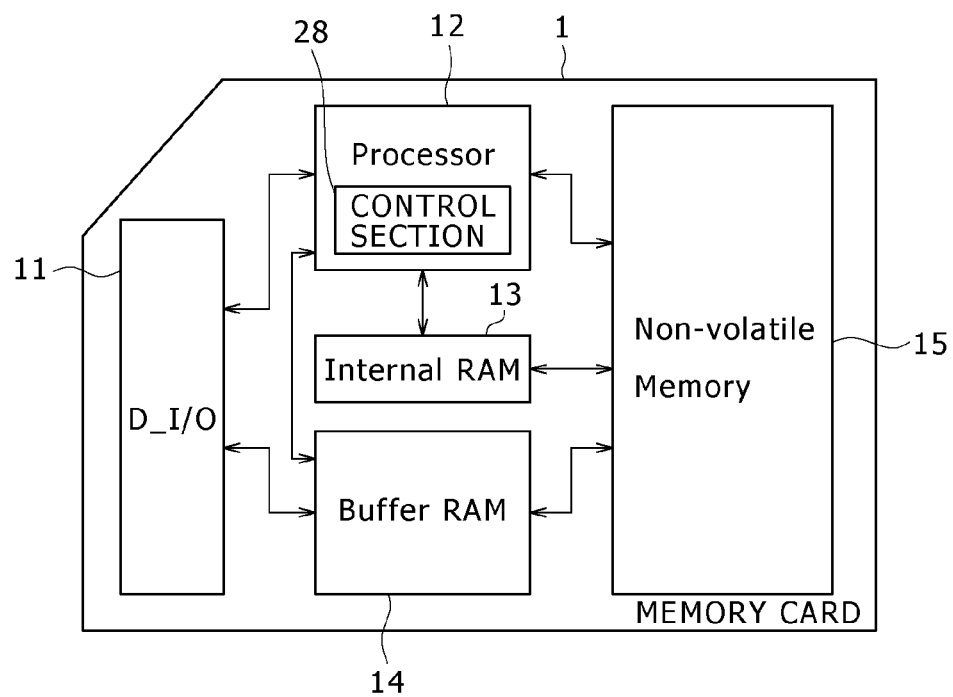
FIG. 1 is a physical block diagram showing a memory card according to an embodiment of the present invention.

FIG. 1 is a physical block diagram showing the memory card 1 according to the embodiment of the present invention.

The memory card 1 shown in FIG. 1 employs a DI/O (device input/output) section 11, a processor 12, an internal RAM 13, a buffer RAM 14 and a nonvolatile memory 15.

The memory card 1 shown in FIG. 1 is designed as a card which is used by connecting the card 1 to a host apparatus (2).

To put it more concretely, the memory card 1 is typically designed as a PC card, a memory-stick (a registered trademark) card or an SD card. In either case, the memory card 1 can be mounted on the host apparatus (2) and dismounted from the host apparatus (2).

Figure 2:
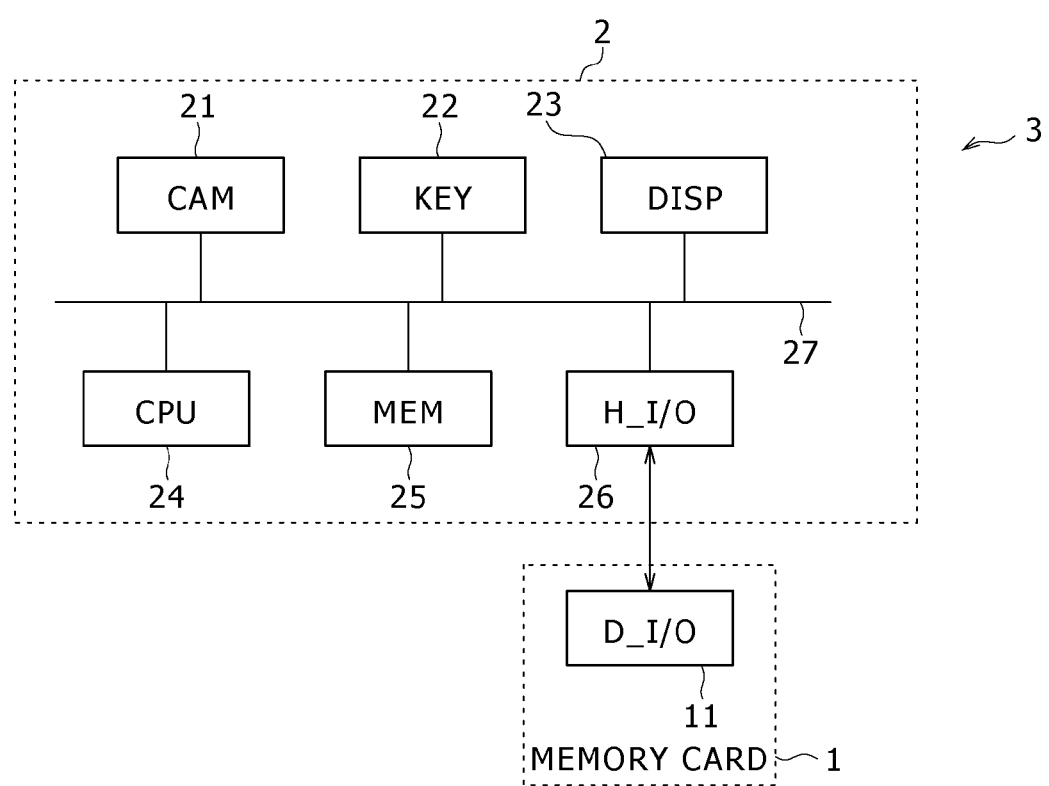
FIG. 2 is a block diagram showing a rough configuration of a camera system employing the memory card shown in FIG. 1.

FIG. 2 is a block diagram showing a rough configuration of a camera system 3 employing the memory card 1 shown in the physical block diagram which serves as FIG. 1.

The camera system 3 shown in FIG. 2 employs the memory card 1 shown in FIG. 1 and a camera apparatus 2 which functions as the host apparatus (2).

The camera apparatus 2 employed in the camera system 3 shown in the block diagram serving as FIG. 2 employs a picture taking section (CAM) 21, an operation section (KEY) 22, a display section (DISP) 23, a CPU 24, a memory (MEM) 25, a host input/output section (H I/O) 26 as well as a system bus 27 which is used for connecting these components to each other.

The picture taking section 21 typically has a CMOS sensor, a CCD or the like.

The picture taking section 21 generates moving-picture data including pictures and voices/sounds, supplying a signal conveying the moving-picture data to the CPU 24.

The operation section 22 typically has a picture taking button and arrow keys.

The operation section 22 supplies a signal according to an operated button or key to the CPU 24.

The display section 23 typically has a TFT display unit or an organic EL display unit.

The display section 23 receives a picture signal from the CPU 24 and displays a picture based on the picture signal.

The memory 25 is used for storing data and programs to be executed by the CPU 24.

The CPU 24 reads in a program stored in advance in the memory 25 and executes the program.

By executing the programs, the CPU 24 serves as a control section 28 of the camera apparatus 2.

The control section 28 carries out control by managing sections including the picture taking section 21, the display section 23 and the host input/output section 26.

The host input/output section 26 employed in the host apparatus (2) has a connector. The memory card 1 can be attached to the connector or detached from the connector.

The host input/output section 26 exchanges data with the device input/output section 11 in accordance with a communication method which conforms to specifications such as the PCI Express specifications or the USB specifications.

The host apparatus (2) makes an access to the memory card 1 in order to write data into the memory card 1 or read out data from the memory card 1.

The memory card 1 shown in FIG. 1 can be put in a slot or a port of the host input/output section 26 and removed from the slot or the port.

The CPU 24 employed in the camera apparatus 2 typically controls the picture taking section 21 to take a moving picture and stores data of the taken moving picture in the memory card 1. At this time, the CPU 24 employed in the camera apparatus 2 makes a write access to the memory card 1.

In addition, the camera apparatus 2 reads out typically image data from the memory card 1 and displays the image data on the display section 23. At this time, the CPU 24 employed in the camera apparatus 2 makes a read access to the memory card 1.

2: Structure of the Multi-Value Memory Card 1

The nonvolatile memory 15 employed in the memory card 1 shown in FIG. 1 is typically a nonvolatile semiconductor memory such as a flash memory of the NAND type.

Figure 3:
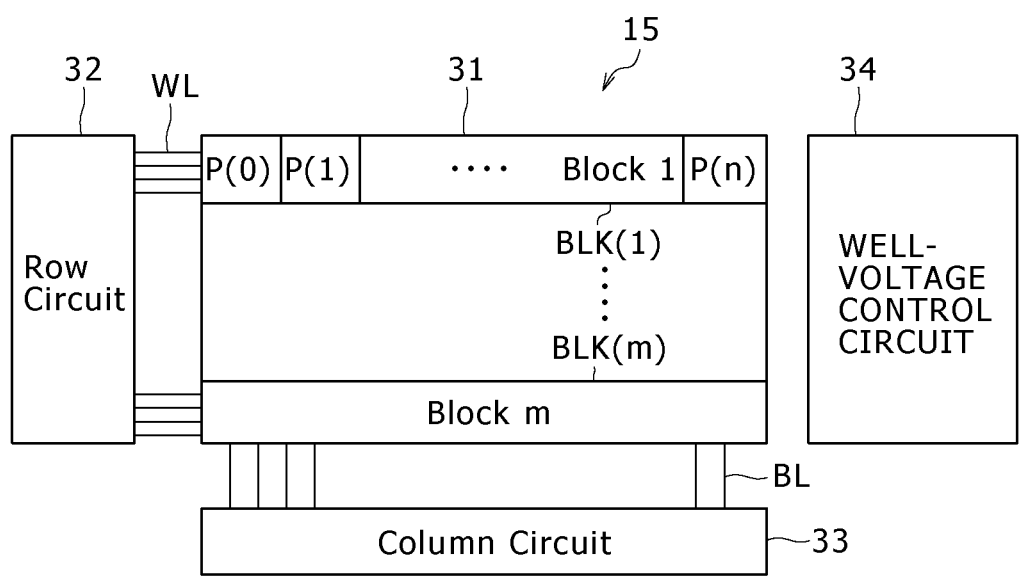
FIG. 3 is a block diagram showing the internal structure of a nonvolatile memory shown in FIG. 1.

FIG. 3 is a block diagram showing the internal structure of the nonvolatile memory 15.

The nonvolatile memory 15 employs a memory array 31, a row circuit 32, a column circuit 33 and a well-voltage control circuit 34.

The memory array 31, the row circuit 32, the column circuit 33 and the well-voltage control circuit 34 are created on a semiconductor substrate shown in none of the figures to form a layout like one shown in FIG. 3.

The memory array 31 has a plurality of physical blocks.

The memory array 31 shown in FIG. 3 has m physical blocks, i.e., physical blocks BLK(1) to BLK(m).

Each of the physical blocks BLK(1) to BLK(m) has a plurality of pages, i.e., pages P(0) to P(n).

In this embodiment, each of the pages P(0) to P(n) is one of a plurality of storage areas, i.e., one of n storage areas.

Each of the pages P(0) to P(n) has a plurality of cells not shown in FIG. 3.

By making use of floating gates, each of the cells is capable of holding four different threshold voltages obtained as a result of a process of converting typically 2-bit data into multi-valued data.

Thus, the physical block has physical pages, the number of which is a multiple of a page count representing the number of logical pages arranged a row of the memory array 31 employed in the nonvolatile memory 15 shown in FIG. 3.

If two pieces of data are stored in respectively two physical pages of a logical page by converting each of the pieces of data into multi-value data for example, the physical block has physical pages, the number of which is 2×n where reference symbol n denotes the page count n representing the number of logical pages arranged a row of the memory array 31 employed in the nonvolatile memory 15 shown in FIG. 3.

The cells are arranged to form a two-dimensional matrix in the entire area of the memory array 31 which is created on the semiconductor substrate.

A plurality of cells on a row of the two-dimensional matrix are connected to a specific one of a plurality of word lines WL which are connected to the row circuit 32. The specific word line WL is associated with the row.

By the same token, a plurality of cells on a column of the two-dimensional matrix are connected to a specific one of a plurality of bit lines BL which are connected to the column circuit 33. The specific bit line BL is associated with the column.

Each of the word lines WL is driven by the row circuit 32 to select a plurality of cells included in a physical block associated with the word line WL or, in other words, to select the physical block, whereas each of the bit lines BL is driven by the column circuit 33 to select a plurality of cells included in a page associated with the bit line BL or, in other words, to select the page.

Then, the column circuit 33 reads in threshold voltages of selected cells included in the selected page in order to generate bit data from the threshold voltages of the selected cells and outputs the bit data as read data.

A plurality of cells are created in typically a P well on an N-type semiconductor substrate. The well-voltage control circuit 34 controls the voltage of the P well.

By controlling the voltage of the P well, an aforementioned threshold voltage corresponding to bit data is written into a cell created in the P well.

Figure 4:
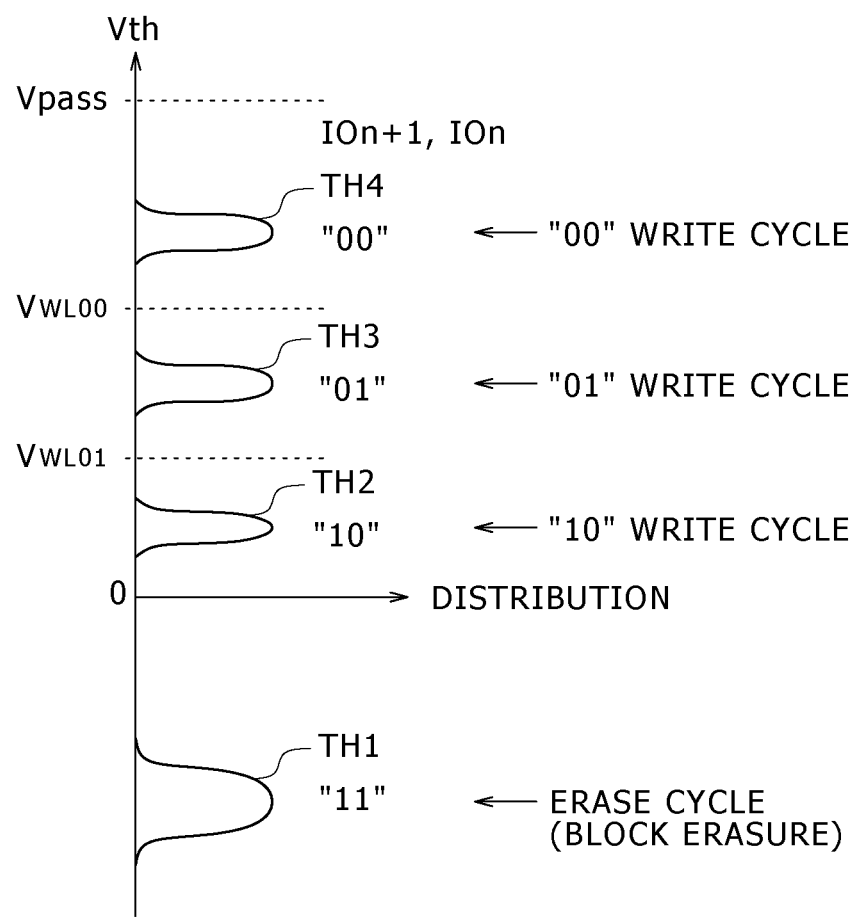
FIG. 4 is an explanatory diagram to be referred to in description of four different typical threshold voltages each written into a cell of a memory array shown in FIG. 3.

FIG. 4 is an explanatory diagram referred to in the following description of the four different typical threshold voltages each written into a cell of the memory array 31 shown in FIG. 3.

The vertical axis of FIG. 4 represents the threshold voltages whereas the horizontal axis of the diagram represents the distributions of the threshold voltages among a plurality of cells.

In FIG. 4, the threshold voltages each to be written into a cell are a first threshold voltage TH1, a second threshold voltage TH2, a third threshold voltage TH3 and a fourth threshold voltage TH4.

The first threshold voltage TH1 is a threshold voltage lower than 0 V and corresponds to a 2-bit value of typically 11.

The first threshold voltage TH1 is written into each of cells included in a physical block in an erase operation carried out on the physical block. That is to say, the erase operation is carried out on cells in physical-block units.

The second threshold voltage TH2 is a threshold voltage higher than 0 V and corresponds to a 2-bit value of typically 10.

The second threshold voltage TH2 is written into each of cells included in page unit in a data write operation carried out on the page unit.

The third threshold voltage TH3 is a threshold voltage higher than the second threshold voltage TH2 and corresponds to a 2-bit value of typically 01.

The third threshold voltage TH3 is written into each of cells included in page unit in a data write operation carried out on the page unit.

The fourth threshold voltage TH4 is a threshold voltage higher than the third threshold voltage TH3 and corresponds to a 2-bit value of typically 00.

The fourth threshold voltage TH4 is written into each of cells included in page unit in a data write operation carried out on the page unit.

In an operation to write new data into a page on the basis of a write access made by the host apparatus (2), each of data already stored on the page and the new data to be stored onto the page in the data write operation based on the write access is converted into a piece of multi-value data, and it is necessary to hold each of the pieces of multi-value data in one of cells included in the page.

Thus, in a data write operation, for a cell already used for holding the first threshold voltage TH1 written to the cell in an initialization process or the erase operation cited above, it is necessary to execute a first cycle for writing the second threshold voltage TH2, a second cycle for writing the third threshold voltage TH3 or a third cycle for writing the fourth threshold voltage TH4.

In addition, the nonvolatile memory 15 allows a data write operation and a data read operation to be carried out on every physical-page unit.

On top of that, the nonvolatile memory 15 allows a data write operation (or an initialization process) to be carried out on every physical-block unit.

The nonvolatile memory 15 sustains data written thereon even if the supply of power to the nonvolatile memory 15 is cut off.

The processor 12 employed in the memory card 1 to serve as a control section 28 of the memory card 1 manages all the storage areas of the nonvolatile memory 15 in logical-block units.

A logical block is configured to include k physical blocks cited before where notation k denotes an integer at least equal to 1.

Data located at a logical address used by the host apparatus (2) as data having a fixed length determined arbitrarily is written into a logical block indicated by the logical address.

If data cannot be written into the logical block indicated by the logical address, the memory card 1 acquires a cache block which is a logical block for temporarily storing data and writes the data into the cache block to be stored in the cache block temporarily.

It is to be noted that the size of the storage area of the nonvolatile memory 15 is limited.

Thus, a cache-block count representing the number of cache blocks forming a portion of the storage areas of the nonvolatile memory 15 is also limited as well.

Accordingly, if all the cache blocks allocated in the nonvolatile memory 15 to serve as cache blocks with a limited cache-block count are already used, the memory card 1 carries out a garbage collection operation.

By this garbage collection operation, the already used cache blocks are initialized and released.

In addition, if valid data is stored in both a cache block and a logical block at the same logical address representing a storage range, the valid data is left in a single logical block.

FIG. 5 is an explanatory diagram referred to in the following description of a relation between a plurality of physical pages in one physical block and storage areas of the same physical block.

FIG. 5 shows (n+1) first physical pages A0 to An each holding data written earlier in the storage areas P(0) to P(n) respectively and (n+1) second physical pages B0 to Bn each holding data written after the first physical pages A0 to An in the same storage areas P(0) to P(n) respectively. It is to be noted that, in FIG. 5, reference notations A0 to An and B0 to Bn are written as reference notations A-10 to A-n and B-0 to B-n respectively. Also in FIGS. 8A to 9C, reference notations A0 to An and B0 to Bn are written as reference notations A-10 to A-n and B-0 to B-n respectively.

In addition, data for the first physical page A0 and data for the second physical page B0 which are shown in FIG. 5 are stored on the logical page P(0) shown in FIG. 3 by converting each of the data for the first physical page A0 and the data for the second physical page B0 into multi-value data.

By the same token, data for the first physical page A1 and data for the second physical page B1 which are shown in FIG. 5 are stored on the logical page P(1) shown in FIG. 3 by converting each of the data for the first physical page A1 and the data for the second physical page B1 into multi-value data.

Figure 6:
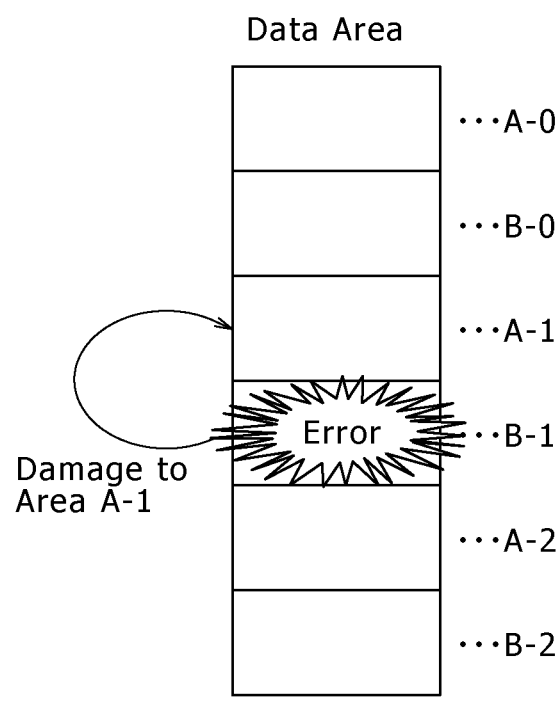
FIG. 6 is an explanatory diagram to be referred to in description of a circumstance in which data of a first physical page is destroyed during an operation to write data of a second physical page.

FIG. 6 is an explanatory diagram referred to in the following description of a circumstance in which data of a first physical page is destroyed during an operation to write data of a second physical page.

FIG. 6 shows three first physical pages A0, A1 and A2 as well as three second physical pages B0, B1 and B2. FIG. 6 is an explanatory diagram referred to in the following description of a case in which pieces of data are written into the three first physical pages A0, A1 and A2 as well as the three second physical pages B0, B1 and B2 in the order of A0, B0, A1, B1, A2 and B2.

After the operations to write pieces of data into the pages A0, B0 and A1 have been completed normally, the operation to write pieces of data into the second physical page B1 ends in a failure.

In this case, not only is an error generated in the data written into the second physical page B1 in a data write operation ending in a failure, but it is quite within the bounds of possibility that an error is also generated in the data written into the first physical page A1.

That is to say, in the nonvolatile memory 15 allowing pieces of data for a plurality of physical pages to be stored in one logical page (that is, one storage area) by converting each of the pieces of data into multi-value data, if the additional-write operation to write new data into a logical page (that is, a storage area) already used for holding other data stored previously ends in a failure, it is quite within the bounds of possibility that the other data is also lost from a physical page forming a pair in conjunction with a physical page allocated to the new data in the storage area.

The reader is requested to refer back to FIG. 1 showing the configuration of the memory card 1. The device input/output section 11 is connected to the host input/output section 26.

The host input/output section 26 exchanges data with the device input/output section 11 in accordance with a high-speed serial-data communication method which conforms to specifications such as the PCI Express specifications or the USB3.0 specifications.

In a write access made by the host apparatus (2) for example, the device input/output section 11 receives a write command, write data and/or other information from the host input/output section 26. The device input/output section 11 transmits a write-access successful-completion notice signal to the host input/output section 26 as a response signal.

In a read access made by the host apparatus (2), on the other hand, the device input/output section 11 receives a read command and/or other information from the host input/output section 26. The device input/output section 11 transmits read data and a read-access completion notice signal to the host input/output section 26 as a response signal.

The buffer RAM 14 is typically an SRAM or a DRAM.

The buffer RAM 14 is connected to the device input/output section 11, the nonvolatile memory 15 and the processor 12.

The device input/output section 11 writes write data, which has been received from the host apparatus (2) to be eventually written into the nonvolatile memory 15, into the buffer RAM 14.

The write data written into the buffer RAM 14 is eventually transferred to the nonvolatile memory 15 in accordance with control carried out by the processor 12.

On the other hand, read data read out from the nonvolatile memory 15 as requested by the host apparatus (2) is transferred from the nonvolatile memory 15 to the buffer RAM 14 also in accordance with control carried out by the processor 12.

The read data transferred to the buffer RAM 14 is read out by the device input/output section 11.

The internal RAM 13 is also typically an SRAM or a DRAM.

The internal RAM 13 is connected to the nonvolatile memory 15 and the processor 12.

The internal RAM 13 is used for storing an address conversion table for converting a logical address specified in a write or read access made by the host apparatus (2) as an access to the memory card 1 into a physical address in the nonvolatile memory 15. Thus, the address conversion table is also referred to as a logical/physical conversion table.

The processor 12 is connected to the device input/output section 11, the internal RAM 13, the buffer RAM 14 and the nonvolatile memory 15.

The processor 12 employs a CPU and a memory.

The CPU of the processor 12 reads a firmware program stored in advance in the memory and executes the program. In this way, the processor 12 serves as the control section 28 of the memory card 1.

The control section 28 communicates with the host apparatus (2) through the device input/output section 11 and interprets an access command received from the host apparatus (2) in order to carry out processing in accordance with the access command.

In a write access made by the host apparatus (2) for example, the host apparatus (2) issues a write command to the memory card 1.

The control section 28 interprets the write command received from the host apparatus (2) in order to carry out write processing to store write data, which is also received from the host apparatus (2) along with the write command in the write access, into the nonvolatile memory 15 in accordance with the write command.

In the write processing, the control section 28 normally makes use of the logical/physical conversion table to specify an address of a physical address which corresponds to a write address (logical address).

Subsequently, the control section 28 specifies the physical address in the nonvolatile memory 15 in a request for a transfer of the write data from the buffer RAM 14 to the physical address, requesting the transfer of the write data.

As a result, in the nonvolatile memory 15, the write data is stored at the physical address as data of a predetermined physical page.

In addition, the control section 28 also updates the logical/physical conversion table.

By the way, if free cache blocks are no longer available in a write operation due to previous write operations to write new data into the memory card 1, the control section 28 carries out a garbage collection operation on cache blocks during the write operation.

In the garbage collection operation carried out on cache blocks, the control section 28 typically copies data on a valid physical page of each of the cache blocks to a logical block corresponding to the cache block.

In addition, the control section 28 also updates the logical/physical conversion table.

On top of that, the control section 28 initializes each of the cache blocks which have been subjected to the garbage collection operation.

Each of the initialized cache blocks can then be used as a new free cache block that can be acquired by the control section 28.

In the next write access for example, the control section 28 is capable of acquiring a free cache block and making use of the acquired free cache block.

In addition, the host apparatus (2) also makes a read access to the memory card 1. In the read access, the host apparatus (2) issues a read command to the memory card 1.

The control section 28 interprets the read command and carries out a read operation to read out read data from the nonvolatile memory 15 and supplies the read data to the host apparatus (2).

Details of the read operation are explained as follows. First of all, the control section 28 makes use of the logical/physical conversion table to specify an address of a most recent physical page associated with a logical address specified in the read command.

Then, the control section 28 specifies the address of the physical page to the nonvolatile memory 15.

The nonvolatile memory 15 reads out a data from the address of the physical page and writes the data to buffer RAM 14.

Finally, the device input/output section 11 reads out the read data from the buffer RAM 14 and supplies the data to the host apparatus (2).

3: Additional-Write Operation (Garbage Collection Operation) in a Write Access in this Embodiment Next, operations carried out by the memory card 1 according to the embodiment are explained below. In particular, this chapter also explains a typical garbage collection operation carried out as internal processing in the period of a write access.

The operations are described below by taking operations, which are carried out by the memory card 1 when the host apparatus (2) makes a write access to the memory card 1, as an example.

In addition, the following description also explains a garbage collection operation carried out on cache blocks in the period of the write access made by the host apparatus (2).

Figure 7:
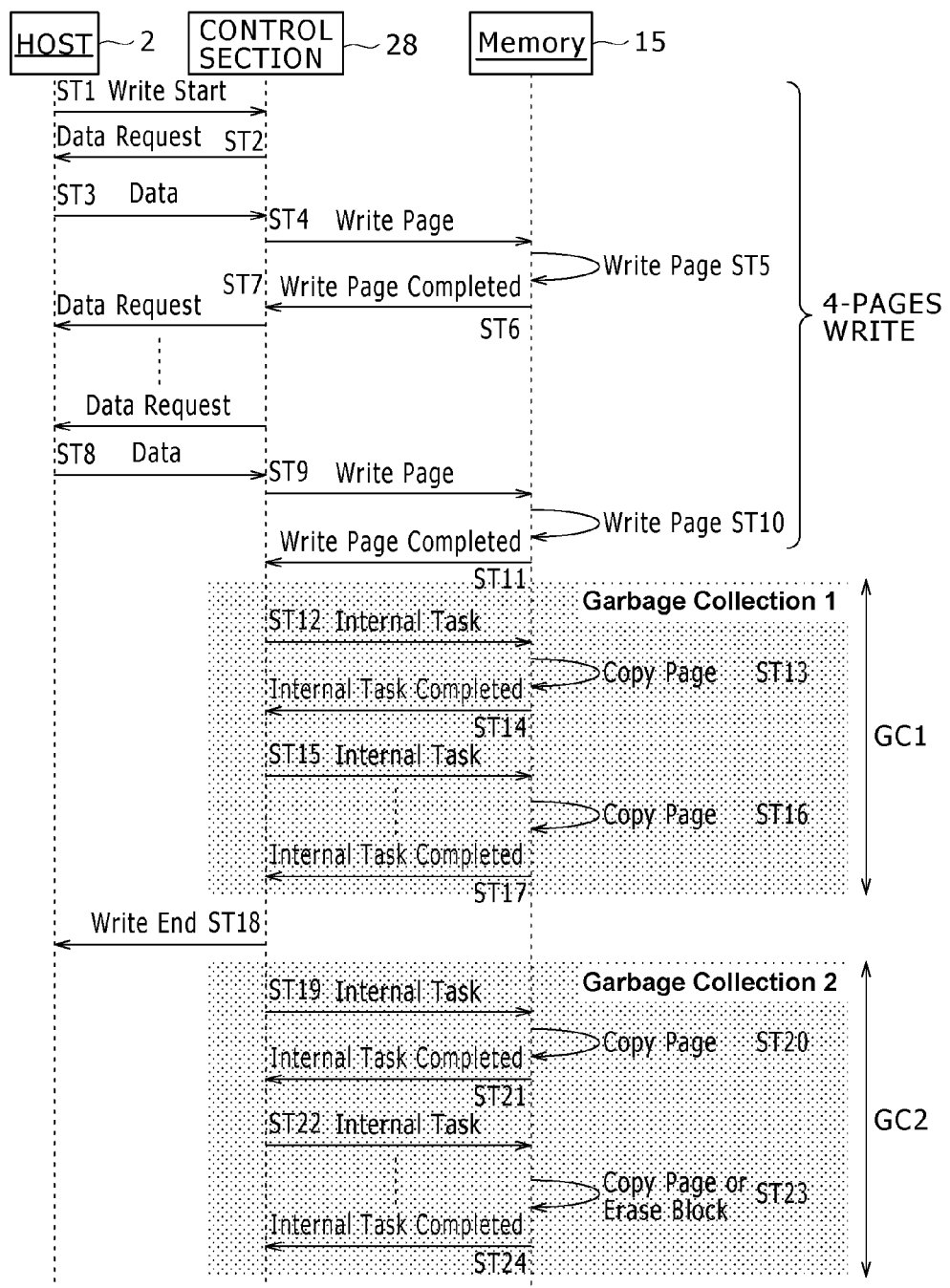
FIG. 7 shows a chart of a sequence of operations carried out during the period of a write access made by a host apparatus shown in FIG. 2.

FIG. 7 shows a chart of a sequence of operations carried out during the period of a write access made by the host apparatus (2) shown in FIG. 2 in order to write data into the memory card 1.

In FIG. 7, there are shown the host apparatus (2), the control section 28 of the memory card 1 and the nonvolatile memory 15. Also in FIG. 7, the time axis is oriented in the vertical direction, starting from the top of the diagram.

It is to be noted that, in FIG. 7, the host apparatus (2) writes data having a size of four pages into respectively four separate first physical pages in the memory card 1.

In addition, by carrying out a garbage collection operation, data of valid pages of a cache block is further written into four second physical pages associated with respectively the four first physical pages in the memory card 1.

In a write access made by the host apparatus (2) as an access to the memory card 1, the CPU 24 employed in the host apparatus (2) issues a write command to the memory card 1 at a step ST1.

The write command is transmitted from the host input/output section 26 to the device input/output section 11 and received by the control section 28 which is actually the processor 12.

Receiving the write command, the control section 28 issues a data request to the host apparatus (2) at the next step ST2.

The data request is transmitted from the device input/output section 11 to the host input/output section 26 and received by the CPU 24 employed in the host apparatus (2).

Then, at the next step ST3, the host apparatus (2) outputs the write data to the memory card 1.

The write data is transmitted from the host input/output section 26 to the device input/output section 11 and stored in the buffer RAM 14.

As the write data is stored in the buffer RAM 14, the control section 28 starts an operation to transfer the write data from the buffer RAM 14 to the nonvolatile memory 15.

At the next step ST4, the control section 28 refers to the logical/physical conversion table to specify a physical address of a physical block into which the write data is to be stored for the nonvolatile memory 15.

At this time, the control section 28 specifies a physical address which corresponds to an available first page in the physical block into which the write data is to be stored.

If an available physical page remaining in an initialized state does not exist in the physical block included in the nonvolatile memory 15 to serve as a physical block into which the write data is to be stored, the control section 28 acquires a cache block which corresponds to the logical address and specifies a first physical page included in a cache block.

Then, at the next step ST5, the nonvolatile memory 15 reads the write data from the buffer RAM 14 to store the write data in the specified physical address.

As a result, the write data of the host apparatus (2) is stored in the first page of the physical block.

As the write operation to store the write data in the nonvolatile memory 15 is completed, the flow of the sequence of operations goes on to the next step ST6 at which the nonvolatile memory 15 provides the control section 28 with a write-operation completion signal which notifies the control section 28 that the write operation has been completed.

When the control section 28 is informed that the write operation to store the first write data into the nonvolatile memory 15 has been completed, the flow of the sequence of operations goes on to the next step ST7 at which the control section 28 issues a request for the next write data to the host apparatus (2).

The host apparatus (2) supplies the next write data to the memory card 1 at the next step ST8.

The next write data is stored in the buffer RAM 14.

At the next step ST9, as a next write destination of the write data, the control section 28 specifies the physical address which corresponds to an available first page in the physical block into which the write data is to be stored.

Then, at the next step ST10, the nonvolatile memory 15 reads out the next write data from the buffer RAM 14 to store the write data into the specified first page.

As the write operation to store the next write data in the nonvolatile memory 15 is completed, the flow of the sequence of operations goes on to the next step ST11 at which the nonvolatile memory 15 provides the control section 28 with a write-operation completion signal which notifies the control section 28 that the write operation has been completed.

In the typical operation sequence shown in FIG. 7, the memory card 1 receives write data of four pages from the host apparatus (2), and the control section 28 stores the write data of four pages into the nonvolatile memory 15.

In addition, the control section 28 of the memory card 1 determines whether or not unused cache blocks are left.

If no unused cache blocks are left, the control section 28 carries out a garbage collection operation on already used cache blocks.

It is to be noted that, while the control section 28 is carrying out a garbage collection operation to process the cache blocks, the control section 28 does not communicate with the host apparatus (2).

That is to say, the garbage collection operation is an operation carried out as an internal task in the memory card 1.

The garbage collection operation is carried out during the period of a write access made by the host apparatus (2) actually as follows. The control section 28 carries out the garbage collection operation on one specific cache block selected among a plurality of used cache blocks.

The control section 28 starts the garbage collection operation to be carried out on the specific cache block.

To put it more concretely, at the next step ST12, the control section 28 notifies the nonvolatile memory 15 of a second physical page of the physical block having a first physical page in the same logical page as the second physical page to serve as a first physical page already used for holding write data received from the host apparatus (2). Then, the control section 28 carries out a garbage collection operation on a first valid page of the specific cache block which serves as the subject of the garbage collection operation as follows.

At the next step ST13, the write data stored on the first valid physical page of the specific cache block serving as the subject of the garbage collection operation is copied to the second physical page of the physical block having a first physical page in the same logical page as the second physical page to serve as a first physical page already used for holding write data received from the host apparatus (2).

After the write data has been copied from the first valid page of the cache block to the second physical page of the physical block as described above, the flow of the sequence of operations goes on to the next step ST14 at which the nonvolatile memory 15 provides the control section 28 with a copy completion signal which notifies the control section 28 that the copy operation has been completed.

Receiving the copy completion signal from the nonvolatile memory 15, the control section 28 of the memory card 1 updates the logical/physical conversion table.

After the garbage collection operation carried out on the first valid page of the specific cache block serving as the subject of the garbage collection operation has been completed, the flow of the sequence of operations goes on to the next step ST15 at which the control section 28 carries out the garbage collection operation on a next valid page of the cache block as follows.

At the step ST15, the control section 28 notifies the nonvolatile memory 15 of another second physical page of the physical block having a first physical page for holding write data received from the host apparatus (2). Then, the control section 28 carries out a garbage collection operation on the next valid page of the cache block serving as the subject of the garbage collection operation as follows.

At the next step ST16, the write data stored on the next valid first physical page of the cache block serving as the subject of the garbage collection operation is copied to the other second physical page of the physical block having a first physical page in the same logical page as the other second physical page to serve as a first physical page already used for holding write data received from the host apparatus (2).

After the write data has been copied from the next valid page of the cache block to the other second physical page of the physical block as described above, the flow of the sequence of operations goes on to the next step ST17 at which the nonvolatile memory 15 provides the control section 28 of the memory card 1 with a copy completion signal which notifies the control section 28 that the copy operation has been completed.

Receiving the copy completion signal from the nonvolatile memory 15, the control section 28 of the memory card 1 updates the logical/physical conversion table.

As described above, the control section 28 repeatedly carries out the garbage collection operation on a valid page of a cache block, which serves as the subject of the garbage collection operation, in order to sequentially perform the garbage collection operation on all valid pages of the cache block.

Then, as the control section 28 determines the completion of the garbage collection operation carried out on the physical block for its all second physical pages each forming a pair in conjunction with one of a plurality of first physical pages on which write data received from the host apparatus (2) has been stored in a write access, the control section 28 suspends the garbage collection operation.

Subsequently, after the control section 28 has suspended the garbage collection operation, the flow of the sequence of operations goes on to the next step ST18 at which the control section 28 transmits a signal to the host apparatus (2) to serve as a write-access successful-completion signal which notifies the control section 28 that the write access has been completed successfully.

The write-access successful-completion signal is a notification which indicates normal completion of the write access as evidenced by typically the fact that all write data received from the host apparatus (2) has been normally written into a plurality of first physical pages in a physical block and the fact that write data has also been normally copied from a plurality of valid pages in a cache block to respectively a plurality of second physical pages each forming a pair in conjunction with one of the first physical pages in the physical block by carrying out the garbage collection operation as described above.

Receiving the write-access successful-completion signal from the memory card 1, the host apparatus (2) destroys the write data, which has been stored in the memory card 1 in the period of the write access, and prepares write data to be written into the memory card 1 next.

If at least one-page write data received from the host apparatus (2) has not been normally written into any of a plurality of first physical pages in a physical block or at least one-page write data has not been normally copied from any of a plurality of valid pages in a cache block to one of a plurality of second physical pages each forming a pair in conjunction with one of the first physical pages in the physical block during garbage collection operation carried out as described above, on the other hand, the control section 28 of the memory card 1 transmits a signal to the host apparatus (2) to serve as a write-access failure signal which notifies the control section 28 that the write access has ended in a failure.

Receiving the write-access failure signal from the memory card 1, the host apparatus (2) makes another write access to the memory card 1 in order to repeat the write operations described above.

As a matter of fact, till the host apparatus (2) receives a write-access successful-completion signal from the memory card 1, the host apparatus (2) makes a write access to the memory card 1 repeatedly in an attempt to store write data, which has not been stored successfully in the memory card 1 as indicated by the write-access failure signal.

Thus, till the write access is completed successfully, the memory card 1 repeatedly acquires write data from the host apparatus (2) and stores the write data into the nonvolatile memory 15.

After the control section 28 has transmitted the signal to the host apparatus (2) at the step ST18 to serve as a write-access successful-completion signal, the control section 28 resumes the suspended garbage collection operation.

That is to say, at the next steps ST19 to ST21, the control section 28 carries out a garbage collection operation on remaining valid physical pages in the cache block which serves as the subject of the garbage collection operation.

To put it more concretely, the control section 28 copies write data stored on the valid physical pages of the cache block serving as the subject of the garbage collection operation to a specified physical block.

In the resumed garbage collection operation, the control section 28 also informs the nonvolatile memory 15 of a first physical page in the physical block to be used as a page to which the write data stored in the valid page on the cache block is to be copied.

Typically, the control section 28 also informs the nonvolatile memory 15 of a first physical page or a second physical page in the physical block alternately.

Then, after the control section 28 has completed the copy operations to copy write data stored in all valid pages included in the cache block to serve as the subject of the garbage collection operation to the physical block, at the next steps ST22 to ST24, the control section 28 initializes the valid pages already subjected to the garbage collection operation which has been carried out to copy the write data stored in the valid pages to the physical block of the nonvolatile memory 15.

As a result, the cache block already subjected to the garbage collection operation can be reused as a new cache block.

FIGS. 8A to 8C are a plurality of explanatory diagrams referred to in the following description of data changes obtained as a result of a garbage collection operation carried out in the period of a write access made by the host apparatus (2) in accordance with this embodiment.

To be more specific, FIG. 8A is an explanatory diagram showing a data state existing at a point of time at which write data received from the host apparatus (2) has been stored in first physical pages A0 to A3 in a physical block.

FIG. 8B is an explanatory diagram showing a data state existing at a point of time at which the garbage collection operation is suspended before a write-access successful-completion notice signal is transmitted by the memory card 1 to the host apparatus (2) as a response signal.

FIG. 8C is an explanatory diagram showing a data state existing at a point of time at which the garbage collection operation is resumed after a write-access successful-completion notice signal has been transmitted.

In each of FIGS. 8A to 8C, a block on the right side is referred to as a specified block in the following description. The specified block is an ordinary logical block into which write data received from the host apparatus (2) is stored.

On the other hand, the so-called source block on the left side is a cache block which serves as the subject of the garbage collection operation.

As described above, FIG. 8A shows a data state in which write data received from the host apparatus (2) has been stored in four pages, i.e., the first physical pages Ao to A3 in the specified block.

As shown in FIG. 8B, before the control section 28 suspends the garbage collection operation, the control section 28 copies write data of four pages in the source block to respectively four pages, i.e., the second physical pages BO to B3 in the specified block.

At the end of the internal copy processing shown in FIG. 8B, the control section 28 suspends the garbage collection operation and transmits a write-access successful-completion notice signal to the host apparatus (2) as a response signal.

Later on, the control section 28 resumes the garbage collection operation in order to copy write data of remaining pages in the source block to the specified block.

FIG. 8C shows a state in which write data of a page in the source block has been copied to a first physical page A4 in the specified block during the resumed garbage collection operation.

In the state shown in FIG. 8C, the first physical page A4 in the specified block and subsequent pages following the first physical page A4 in the specified block do not include a page forming a pair with any one of the first physical pages AO to A3 in which write data received from the host apparatus (2) has been stored.

Thus, in this embodiment, even if the copy operation shown in FIG. 8C as an operation to copy write data from the source block to the specified block ends in a failure, no error is generated in the write data received from the host apparatus (2) and stored in four pages, i.e., the first physical pages AO to A3 in the specified block.

Next, a variety of typical comparison configurations to be compared with the embodiment described above are explained below.

In the explanation of the typical comparison configurations, every element identical with its counterpart employed in the embodiment is denoted by the same reference numeral or the same reference symbol as the counterpart. In addition, the explanation of the typical comparison configurations does not include the description of the configuration of the memory card and the configuration of the host apparatus which are employed in each of the typical comparison configurations.

4: First Typical Comparison (Example of an Insufficient Additional-Write Operation in a Write Access)

This chapter explains a first typical comparison configuration in which, after the garbage collection operation has been carried out to process a fixed number of pages in a cache block serving as a source block, the memory card 1 transmits a write-access successful-completion notice signal to the host apparatus (2) as a response signal.

In the first typical comparison configuration, during the period of a write access made by the host apparatus (2), the control section 28 carries out a garbage collection operation to process a cache block.

In addition, after the garbage collection operation has been carried out to process a fixed number of pages (for example, three pages) in the cache block serving as a source block, the control section 28 transmits a write-access successful-completion notice signal to the host apparatus (2) as a response signal.

Figure 9A:
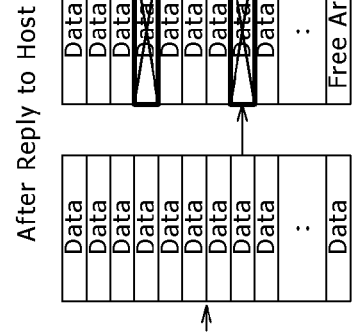
FIGS. 9A to 9C are a plurality of explanatory diagrams to be referred to in description of data changes obtained as a result of garbage collection processing carried out in a first typical comparison.
Figure 9B:
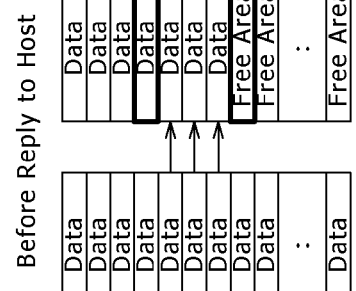
Figure 9C:
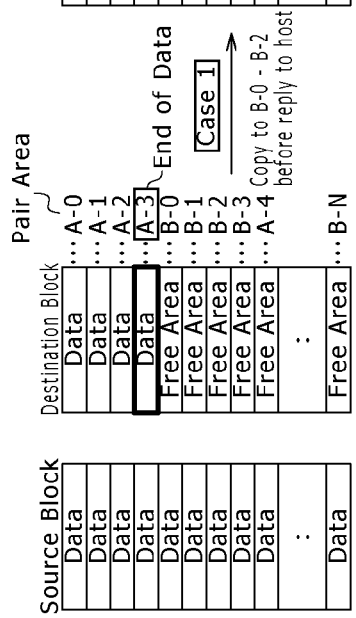

FIGS. 9A to 9C are a plurality of explanatory diagrams referred to in the following description of data changes obtained as a result of garbage collection processing carried out in the first typical comparison configuration during the period of a write access made by the host apparatus (2).

To be more specific, FIG. 9A is an explanatory diagram showing a data state existing at a point of time at which write data received from the host apparatus (2) has been stored in first physical pages AO to A3 of a physical block.

FIG. 9B is an explanatory diagram showing a data state existing at a point of time at which the garbage collection operation is suspended before a write-access successful-completion notice signal is transmitted to the host apparatus (2) as a response signal.

FIG. 9C is an explanatory diagram showing a data state existing at a point of time at which the garbage collection operation is resumed after a write-access successful-completion notice signal has been transmitted to the host apparatus (2) as a response signal.

In each of FIGS. 9A to 9C, a block on the right side is referred to as a specified block in the following description. The specified block is an ordinary logical block into which write data received from the host apparatus (2) is stored.

On the other hand, the so-called source block on the left side is a cache block which serves as the subject of the garbage collection operation.

As described above, FIG. 9A shows a data state in which write data received from the host apparatus (2) has been stored in four pages, i.e., the first physical pages AO to A3 in the specified block.

As shown in FIG. 9B, in the case of the first typical comparison configuration, before the control section 28 of the memory card 1 suspends the garbage collection operation, the control section 28 copies write data of three pages in the source block to respectively 3 pages, i.e., the second physical pages BO to B2 in the specified block.

At the end of the internal copy processing shown in FIG. 9B, the control section 28 terminates the garbage collection operation which has been carried out to process a predetermined number of pages.

That is to say, the control section 28 suspends the garbage collection operation prior to the transmission of the write-access successful-completion notice signal to the host apparatus (2) as a response signal.

Later on, the control section 28 resumes the garbage collection operation.

The control section 28 copies remaining write data from the source block to the specified block.

FIG. 9C shows a state in which write data of a page in the source block has been copied to a second physical page B3 in the specified block during the resumed garbage collection operation.

In this case, however, the write data of a page in the source block has been copied to the second physical page B3 forming a pair with the first physical page A3 included in the specified block to serve as a first physical page on which write data received from the host apparatus (2) has been stored as shown in FIG. 9C.

Thus, in the case of the first typical comparison configuration, if the copy operation to copy the write data of a page in the source block to the second physical page B3 ends in a failure for example, it is quite within the bounds of possibility that an error is also generated in the write data which has been received from the host apparatus (2) and has been stored on the first physical page A3 in the specified block.

5: Second Typical Comparison (Example of a Time Out of a Write-Access Successful-Completion Notice to the Host Apparatus (2))

This chapter explains a second typical comparison configuration in which a garbage collection operation is carried out to process all valid pages in the cache block serving as a source block in the period of a write access.

In the second typical comparison configuration, during the period of a write access made by the host apparatus (2), the control section 28 carries out a garbage collection operation to process a cache block.

In addition, after the garbage collection operation has been carried out to process all valid pages in the cache block serving as a source block, the control section 28 transmits a write-access successful-completion notice signal to the host apparatus (2) as a response signal.

Figure 10:
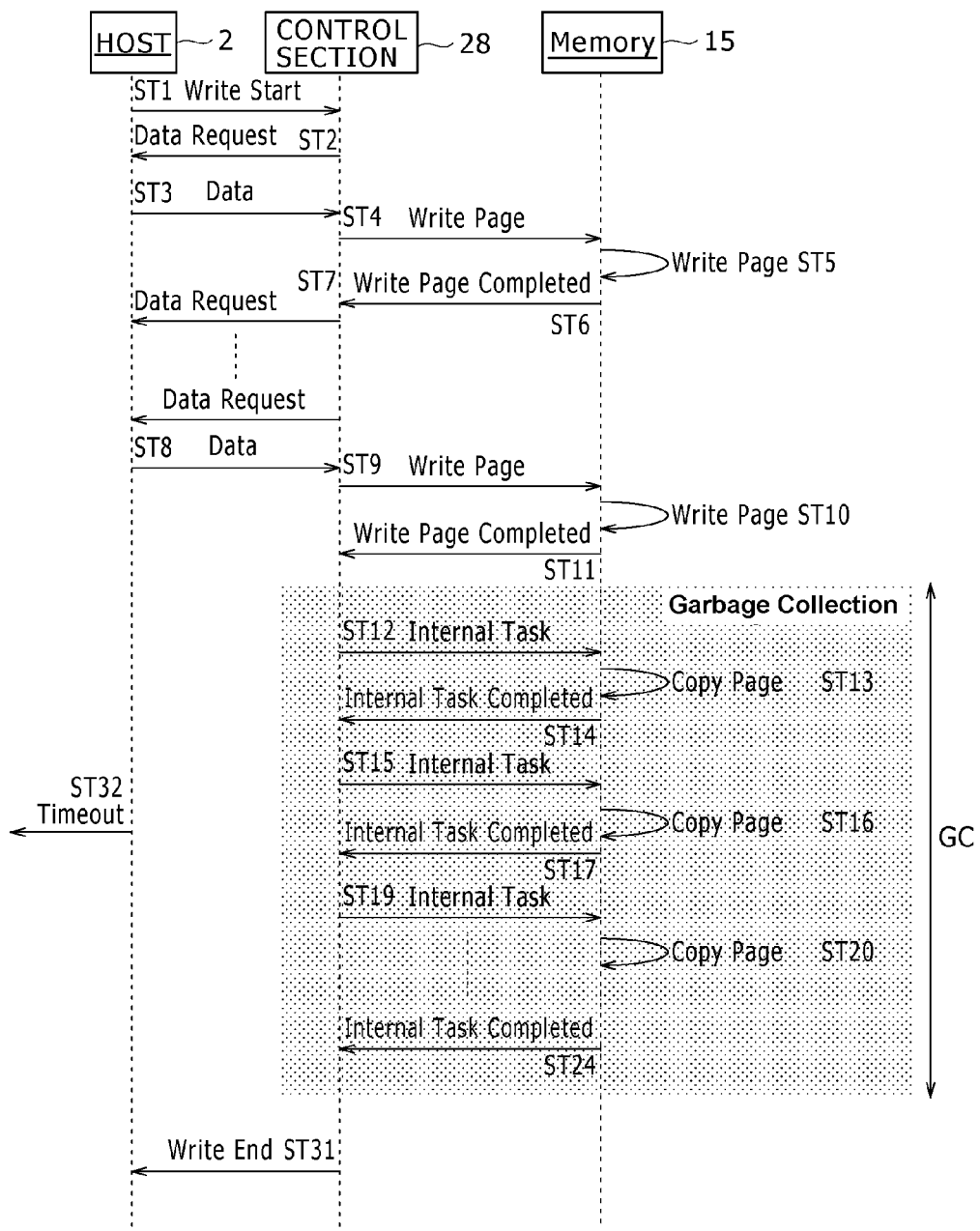
FIG. 10 shows a chart of a sequence of operations carried out during the period of a write access made in a second typical comparison.

FIG. 10 shows a chart of a sequence of operations carried out during the period of a write access made by the host apparatus (2) in the second typical comparison configuration.

In the second typical comparison configuration, when the control section 28 receives a write command from the host apparatus (2), the control section 28 issues a request for write data of the write command to the host apparatus (2).

At steps ST1 to ST11, the write data is received from the host apparatus (2) and stored in the buffer RAM 14 before being transferred from the buffer RAM 14 to the nonvolatile memory 15.

After the write data received from the host apparatus (2) has been transferred from the buffer RAM 14 to the nonvolatile memory 15, the control section 28 carries out the garbage collection operation in order to process a cache block during the period of a write access made by the host apparatus (2).

To put it more concretely, at steps ST12 to ST24, the control section 28 carries out the garbage collection operation in order to process a cache block scheduled for use.

Later on, at a step ST31, the control section 28 transmits a write-access successful-completion notice signal to the host apparatus (2) as a response signal.

With the timing of a step ST32 of the operation sequence shown in FIG. 10, on the other hand, the host apparatus (2) enters the state of a timeout representing the time limit for the response to the write access.

That is to say, the memory card 1 is not capable of transmitting a write-access successful-completion notice signal as a response signal indicating the completion of the write operations and the garbage collection operation before the host apparatus (2) enters the state of the timeout.

As described above, in this embodiment, on the basis of a write access made by the host apparatus (2), the control section 28 of the memory card 1 stores write data received from the host apparatus (2) into physical pages in the nonvolatile memory 15.

In addition, in this embodiment, in the period of a write access, the control section 28 carries out additional-write processing for a second physical page associated with a first physical page on which write data received from the host apparatus (2) has been stored. In this case, the first physical page is a physical page whereas the second physical page is another physical page in the same storage area of a physical block as the first physical page.

Thus, in this embodiment, in the period of a write access made by the host apparatus (2), in a plurality of physical pages forming a set of physical pages in the same storage area also referred to as a logical page in the nonvolatile memory 15, write data and additional-write data which are received from the host apparatus (2) are stored.

As a result, in this embodiment, in a later write access made by the host apparatus (2), an additional-write operation to store other write data is not carried out on a storage area already used for storing write data received previously from the host apparatus (2). A typical example of the storage area already used for storing write data received from the host apparatus (2) is the logical page P(1).

Accordingly, in this embodiment, the write data stored in the storage area such as the page P(1) already holding the write data received earlier from the host apparatus (2) will not be lost even if a write operation carried out in a later write access made by the host apparatus (2) ends in a failure.

As a result, in this embodiment, in the nonvolatile memory 15 used for storing multi-value data on a plurality of physical pages, it is possible to prevent write data from being lost due to an additional-write operation.

Thus, in this embodiment, even if the supply of power to the memory card 1 is cut off during internal data processing which is carried out after a normal write-access successful-completion notice signal has been transmitted as a response signal to the host apparatus (2), it is possible to protect write data received from the host apparatus (2) to which the normal write-access successful-completion notice signal has been transmitted as a response to the write access made to store the write data in the memory card 1.

In addition, in this embodiment, even if a data error is generated due to a failure of the additional-write operation after a normal write-access successful-completion notice signal has been transmitted as a response signal to the host apparatus (2), it is possible to protect write data received from the host apparatus (2) to which the normal write-access successful-completion notice signal has been transmitted as a response to the write access made to store the write data in the memory card 1.

On top of that, in this embodiment, the memory card 1 is capable of transmitting the write-access successful-completion notice signal as a response signal to the host apparatus (2) before the host apparatus (2) enters the state of a timeout.

Thus, in this embodiment, in an operation to save a moving picture taken by the camera apparatus 2 shown in FIG. 2 on a real-time basis, the state of a timeout is never generated due to the garbage collection operation carried out to process a cache block.

That is to say, in this embodiment, by making use of a nonvolatile semiconductor memory such as the flash memory of the NAND type as a storage section used for storing a moving picture, a real-time system can be implemented by this embodiment.

Each of the configurations of the embodiment described above is no more than a typical preferred implementation of the present invention. That is to say, implementations of the present invention are by no means limited to the embodiment. In other words, the embodiment can be changed to a variety of any modified and/or redesigned versions as long as the modified and/or redesigned versions fall within a range which does not deviate from essentials of the present invention.

For example, in the embodiment described above, the control section 28 carries out a garbage collection operation to process a cache block in the period of a write access made by the host apparatus (2). However, the embodiment can be changed to a typical modified version as follows.

For example, the control section 28 may also carry out a garbage collection operation on another block of the nonvolatile memory 15 as internal processing performed in the period of a write access made by the host apparatus (2).

In addition, the control section 28 may also carry out internal processing other than the garbage collection operation.

In the embodiment described above, the control section 28 stores write data received from the host apparatus (2) on a first physical page of a physical block and data copied from a cache block in the garbage collection operation carried out as internal processing on a second physical page of the physical block. However, the embodiment can be changed to a typical modified version as follows.

For example, the control section 28 may also store write data received from the host apparatus (2) on a first physical page and a second physical page alternately in a physical block and data copied from a cache block in the garbage collection operation carried out as internal processing on a second physical page and a first physical page alternately in the physical block.

In the case described above, it is nice to provide a configuration wherein, when the control section 28 stores the last write data received from the host apparatus (2) on a first physical page of a physical block for example, the memory card 1 transmits a write-access successful-completion notice signal as a response signal to the host apparatus (2) at a point of time at which the control section 28 completes the internal processing of copying data from the cache block to a second physical page forming a pair in conjunction with the first physical page.

When the control section 28 stores the last write data received from the host apparatus (2) on a second physical page of a physical block, on the other hand, the memory card 1 transmits a write-access successful-completion notice signal as a response signal to the host apparatus (2) at a point of time at which the control section 28 completes the write operation to store the last write data on the second physical page.

As explained earlier, in the embodiment described above, the control section 28 carries out a garbage collection operation to process a cache block in the period of a write access made by the host apparatus (2). However, the embodiment can be changed to a typical modified version as follows.

For example, the control section 28 may also carry out a garbage collection operation to process a cache block in the period of a read access made by the host apparatus (2).

In the embodiment described above, one processor 12 carries out control processing and the garbage collection operation on the basis of an access made by the host apparatus (2). However, the embodiment can be changed to a typical modified version as follows.

For example, the control section 28 may also carry out the control processing by making use of a specific processor and the garbage collection operation by making use of a processor other than the specific processor.

In the embodiment described above, the memory card 1 makes use of a flash memory of the NAND type to serve as the nonvolatile memory 15 used for storing write data received from the host apparatus (2). However, the embodiment can be changed to a typical modified version as follows.

For example, the memory card 1 may also make use of a nonvolatile memory of another type or a memory of another type to serve as the nonvolatile memory 15 used for storing write data received from the host apparatus (2). A typical example of the nonvolatile memory of another type or the memory of another type is the flash memory of the NOR type.

In the embodiment described above, in the nonvolatile memory 15, two pieces of data are each stored as multi-value data on respectively two physical pages sharing one storage area as a storage area common to the two physical pages. However, the embodiment can be changed to a typical modified version as follows.

For example, in the nonvolatile memory 15, three or more pieces of data can also each be stored as multi-value data on respectively three or more physical pages sharing one storage area as a storage common to the three or more physical pages.

In the embodiment described above, the memory card 1 is used as a storage apparatus of the card type. However, the embodiment can be changed to a typical modified version as follows.

For example, as the storage apparatus, it is also possible to make use of a USB memory, an SSD memory embedded in the host apparatus, an eMMC memory or the like.

In the embodiment described above, the camera apparatus 2 is used as the host apparatus (2). However, the embodiment can be changed to a typical modified version as follows.

For example, as the host apparatus (2), it is also possible to make use of a computer, a mobile phone, an electronic apparatus, a PDA, a navigation apparatus, a reproduction apparatus or the like.

In the embodiment described above, the host input/output section 26 connected to the device input/output section 11 exchanges data with the device input/output section 11 in accordance with a communication method which conforms to specifications such as the PCI Express specifications or the USB3.0 specifications. However, the embodiment can be changed to a typical modified version as follows.

For example, the device input/output section 11 can also exchange data with the host input/output section 26 through short-distance radio communication or the like.

The present application contains subject matter related to that disclosed in Japanese Priority Patent Application JP 2010-060207 filed in the Japan Patent Office on Mar. 17, 2010, the entire content of which is hereby incorporated by reference.

It should be understood by those skilled in the art that a variety of modifications, combinations, sub-combinations and alterations may occur, depending on design requirements and other factors as far as they are within the scope of the appended claims or the equivalents thereof.

What is claimed is:

1. An apparatus comprising:
a memory that allows an operation to be carried out in order to additionally write new write data into a storage area already used for storing previous write data so as to store said new write data in said storage area along with said previous write data;
an input/output section configured to receive said new write data in a write access; and
a control section configured to write said new write data into said memory based on said write access and output a success notification indicating completion of a previous write operation,
wherein said previous write data is stored, based on said previous write operation, in a first physical page forming a pair in conjunction with a second physical page in said storage area,
based on said write access, said control section performs an additional write operation to write said new write data into said storage area already storing said previous write data, and
said new write data is stored in a physical page other than said first and second physical pages in said storage area, after said success notification is output.

2. The apparatus of claim 1, wherein, in said write access, said control section stores said new write data related to said write access into said storage area not used yet for storing data.

3. The apparatus of claim 1, wherein said memory is a semiconductor memory capable of holding said previous write data in said storage area by:
storing said previous write data in said storage area as multi-value data; and
additionally writing said new write data into said storage area already used for holding said previous write data.

4. The apparatus of claim 1, wherein, upon completion of said additional write operation carried out for said storage area already storing said previous write data and said new write data, said control section outputs a response by way of said input/output section.

5. The apparatus of claim 4, wherein, if a write error is generated in said additional write operation carried out for said storage area already storing said previous write data, said control section:
outputs said write error of said new write data related to said write access as a response;
reacquires said new write data for which said write error has been generated in said additional write operation carried out to store said new write data into said storage area; and
stores said reacquired new write data into said memory.

6. The apparatus of claim 1, wherein said control section:
carries out a garbage collection operation in internal processing based on said write access in order to ensure a usable storage area; and
additionally writes said new write data subjected to said garbage collection operation into said storage area already used for storing said previous write data in said write access.

7. The apparatus of claim 6, wherein:
when said new write data subjected to said garbage collection operation has been additionally written into said storage area already storing said previous write data in said write access, said control section suspends said garbage collection operation and outputs a result of said previous write operation based on said write access as a response by way of said input/output section; and
after said result of said previous write operation based on said write access has been output as a response, said control section resumes said suspended garbage collection operation.

8. A system comprising:
a storage apparatus used for storing data written into said storage apparatus; and
a host apparatus for writing said data into said storage apparatus, wherein said storage apparatus comprises:
a memory that allows an operation to be carried out in order to additionally write new write data into a storage area already used for storing previous write data so as to store said new write data in said storage area along with said previous write data;
an input/output section configured to receive said new write data from said host apparatus in a write access made by said host apparatus, and
a control section configured to write said new write data into said memory based on said write access made by said host apparatus and send a success notification to the host apparatus indicating completion of a previous write operation, wherein said previous write data is stored, based on said previous write operation, in a first physical page forming a pair in conjunction with a second physical page in said storage area, based on said write access made by said host apparatus, said control section performs an additional write operation to write said new write data into said storage area already storing said previous write data received from said host apparatus, and said new write data is stored in a physical page other than said first and second physical pages in said storage area, after said success notification is sent.

9. The system of claim 8, wherein, in said write access, said control section stores said new write data related to said write access into said storage area not yet storing data.

10. The system of claim 8, wherein said memory is a semiconductor memory capable of holding said previous write data in said storage area by:

storing said previous write data in said storage area as multi-value data; and additionally writing said new write data into said storage area already storing said previous write data.

11. The system of claim 8, wherein, upon completion of said additional write operation carried out for said storage area already storing said previous write data, said control section outputs a response by way of said input/output section.

12. The system of claim 11, wherein, if a write error is generated in said additional write operation carried out for said storage area already storing said previous write data, said control section:

outputs said write error of said new write data related to said write access as a response;

reacquires said new write data for which said write error has been generated in said additional write operation carried out to store said new write data into said storage area; and stores said reacquired new write data into said memory.

13. The system of claim 8, wherein said control section:

carries out a garbage collection operation in internal processing based on said write access in order to ensure a usable storage area; and additionally writes said new write data subjected to said garbage collection operation into said storage area already storing said previous write data in said write access.

14. The system of claim 13, wherein:

when said new write data subjected to said garbage collection operation has been additionally written into said storage area already storing said previous write data in said write access, said control section suspends said garbage collection operation and outputs result of said previous write operation based on said write access as a response by way of said input/output section; and after said result of said previous write operation based on said write access has been output as a response, said control section resumes said suspended garbage collection operation.

* * * * *